US011095107B2

(12) United States Patent
Butti et al.

(10) Patent No.: US 11,095,107 B2
(45) Date of Patent: Aug. 17, 2021

(54) ELECTRONIC PROTECTION DEVICE

(71) Applicant: ABB Schweiz AG, Baden (CH)

(72) Inventors: Agostino Butti, Vittuone (IT); Antonio Currá, Abbiategrasso (IT); Vittorio Cozzi, Vittuone (IT)

(73) Assignee: ABB Schweiz AG, Baden (CH)

( * ) Notice: Subject to any disclaimer, the term of this patent is extended or adjusted under 35 U.S.C. 154(b) by 360 days.

(21) Appl. No.: 15/945,358

(22) Filed: Apr. 4, 2018

(65) Prior Publication Data

US 2018/0301887 A1    Oct. 18, 2018

(30) Foreign Application Priority Data

Apr. 4, 2017   (EP) .................................... 17164785

(51) Int. Cl.
*H02H 1/00* (2006.01)
*H02H 3/04* (2006.01)
(Continued)

(52) U.S. Cl.
CPC ....... *H02H 1/0007* (2013.01); *G01R 31/3277* (2013.01); *G05B 19/0428* (2013.01);
(Continued)

(58) Field of Classification Search
CPC ........ H01H 71/50; H01H 73/00; H01H 89/06; H01H 3/00; H02H 1/0007
(Continued)

(56) References Cited

U.S. PATENT DOCUMENTS 4,752,853 A    6/1988 Matsko et al.
5,546,266 A    8/1996 Mackenzie et al.
(Continued)

FOREIGN PATENT DOCUMENTS

CN    203339647 U    12/2013
CN    103792459 A    5/2014
(Continued)

OTHER PUBLICATIONS

European Patent Office, Extended Search Report issued in corresponding Application No. 17164785.2, dated Oct. 9, 2017, 7 pp.
(Continued)

*Primary Examiner* — Nguyen Tran
(74) *Attorney, Agent, or Firm* — Taft Stettinius & Hollister LLP

(57) ABSTRACT

An electronic protection device (1) for a LV electric line (100) including one or more conductors (P, N), comprising:

one or more pairs of electric contacts (2) electrically connectable with corresponding conductors of said electric line and adapted to be mutually coupled or decoupled, said electric contacts being coupled when said protection device is in a closed state and being decoupled when said protection device is in a tripped state or open state;

a control unit (3) comprising a controller (31) including data processing resources, said controller being capable of testing the operating conditions of said electronic protection device;

a signalling arrangement (7) including one or more signalling devices (71) driven by said controller.

Said signalling arrangement comprises a first signalling device (71) adapted to provide light signals (L1, L2, L3) indicative of the operating conditions for said electronic protection device, when said electronic protection device is in a closed state.

12 Claims, 4 Drawing Sheets

(51) Int. Cl.
*H02H 9/04* (2006.01)
*H02H 3/00* (2006.01)
*G01R 31/327* (2006.01)
*G05B 19/042* (2006.01)
*G08B 5/36* (2006.01)

(52) U.S. Cl.
CPC ............ *G08B 5/36* (2013.01); *H02H 1/0092* (2013.01); *H02H 3/00* (2013.01); *H02H 3/04* (2013.01); *H02H 3/044* (2013.01); *H02H 9/042* (2013.01); *G05B 2219/24024* (2013.01)

(58) Field of Classification Search
USPC ................ 361/42, 46, 62, 102, 114, 115
See application file for complete search history.

(56) References Cited

U.S. PATENT DOCUMENTS

| | | | |
|---|---|---|---|
| 5,926,355 A | | 7/1999 | Matsko et al. |
| 6,437,700 B1 | | 8/2002 | Herzfeld et al. |
| 8,599,523 B1 | * | 12/2013 | Ostrovsky ............ G08B 21/185 361/45 |
| 9,599,523 B2 | * | 3/2017 | Masuda ................. G01D 5/12 |
| 2002/0093774 A1 | | 7/2002 | Chung |
| 2004/0004801 A1 | | 1/2004 | Bonilla et al. |
| 2005/0103613 A1 | | 5/2005 | Miller |
| 2007/0076337 A1 | | 4/2007 | Huang |
| 2007/0188955 A1 | * | 8/2007 | Elms ...................... H02H 3/338 361/84 |
| 2008/0007879 A1 | * | 1/2008 | Zaretsky ................ H02H 3/335 361/42 |
| 2008/0204947 A1 | * | 8/2008 | Shea ...................... H01H 83/04 361/3 |
| 2010/0149711 A1 | | 6/2010 | Larson et al. |

FOREIGN PATENT DOCUMENTS

| | | |
|---|---|---|
| CN | 105765393 A | 7/2016 |
| CN | 105846803 A | 8/2016 |
| CN | 106099866 A | 11/2016 |
| EP | 2958123 A1 | 12/2015 |
| JP | 2013255385 A | 12/2013 |
| JP | 2015041497 A | 3/2015 |

OTHER PUBLICATIONS

The Patent Office of the People's Republic of China, First Office Action issued in corresponding, Chinese application No. 201810294207.2, dated Mar. 1, 2021, 9 pp.

* cited by examiner

ELECTRONIC PROTECTION DEVICE

The present invention relates to an electronic protection device for low voltage electric lines.

For the purposes of the present application, the term "low voltage" (LV) relates to operating voltages lower than 1 kV AC and 1.5 kV DC.

As is known, an electronic protection device for a LV electric line generally consists in a circuit breaker equipped with an electronic control unit that typically includes a microcontroller.

An electronic protection device is intended to be operatively associated with the conductors of an electric line and is generally adapted to take three different operative states, namely a closed state, a tripped state and an open state.

Normally, an electronic protection device operates in the closed state, at which it enables the current flow along the conductors of the electric line.

Instead, when it is in the tripped state or in the open state, an electronic protection device interrupts the current flow along the conductors of the electric line.

Generally, an electronic protection device is designed to automatically pass (tripping) from the closed state to the tripped state or the open state in case of fault conditions in the electric line or, in some cases, in the protection device itself.

Typical fault conditions may be, for example, ground fault conditions, arc fault conditions, overvoltage conditions, short-circuit conditions, and the like.

As is known, many electronic protection devices of the state of the art are provided with signalling means adapted to provide the user with visual information related to fault conditions possibly causing their automatic tripping.

Examples of said electronic protection devices are disclosed in US2005/0103613A1, US2010/0149711, U.S. Pat. Nos. 5,926,355 and 5,546,266.

In currently available electronic protection devices, however, a user generally cannot receive information on the operating conditions of the internal components of the protection device until this latter has performed an automatic tripping and a subsequent re-closing manoeuvre.

As it is easy to understand, this drawback entails relevant issues in terms of safety since a user cannot know whether an electronic protection device, which is still in the closed state, is properly working, thereby ensuring the requested protection performances. In fact, some internal faults (e.g. in the microcontroller or in the power supply thereof) may prevent the tripping of the electronic protection device, which may remain in the closed state even if it is not able to operate anymore.

Some electronic protection devices of the state of the art have been provided with a controller configured in such a way to command the tripping of the corresponding electronic protection device as soon as any anomalous operating conditions for said electronic protection device are detected.

However, this solution does not mitigate the above-mentioned problems and it may lead to frequent and undesired tripping events of the electronic protection device, as it may often occur that some components of the electronic protection device are subject to transitory malfunctioning, e.g. in case of data corruption events or in case of electromagnetic disturbances. Obviously, this circumstance constitutes a relevant limitation to the operating efficiency of an electronic protection device.

In the state of the art, it is thus quite felt the need for innovative electronic protection devices capable of providing improved signalling performances in such a way to a simpler and safer management of their operating life with respect to traditional devices of similar kind.

In order to respond to this need, the present invention provides an electronic protection device according to the following claim 1 and the related dependent claims.

The electronic protection device, according to the invention, comprises one or more pairs of electric contacts electrically connectable with corresponding conductors of an electric line and adapted to be mutually coupled or decoupled.

Said electric contacts are coupled when said protection device is in a closed state and are decoupled when said protection device is in a tripped state or in an open state.

Conveniently, the electronic protection device comprises a handle movable in different positions depending on the operative state of said electronic protection device.

Conveniently, the electronic protection device further comprises an operating mechanism adapted to mechanically interact with said electric contacts and said handle and a tripping unit adapted to actuate said operating mechanism.

The electronic protection device comprises a control unit comprising a controller including data processing resources.

Such a controller is capable of testing the operating conditions of said electronic protection device, more particularly of internal components of this latter, preferably by cyclically executing software test routines stored in a memory.

The electronic protection device comprises a signalling arrangement including one or more signalling devices driven by said controller and capable of emitting light signals externally to the electronic protection device.

Said signalling arrangement comprises a first signalling device adapted to provide light signals indicative of operating conditions of the electronic protection device, when this latter is in a closed state.

Preferably, said controller is adapted to drive said first signalling device in a non-alarm state, if said controller determines normal operating conditions for the electronic protection device.

Preferably, when it is driven in said non-alarm state, said first signalling device provides at least a first light signal indicative of normal operating conditions for the electronic protection device.

Further characteristics and advantages of the invention will become apparent from the detailed description of exemplary embodiments of the electronic protection device.

BRIEF DESCRIPTION OF THE FIGURES

The description herein makes reference to the accompanying drawings wherein like reference numerals refer to like parts throughout the several views, and wherein.

DETAILED DESCRIPTION OF THE ILLUSTRATIVE EMBODIMENTS

Figure 1:
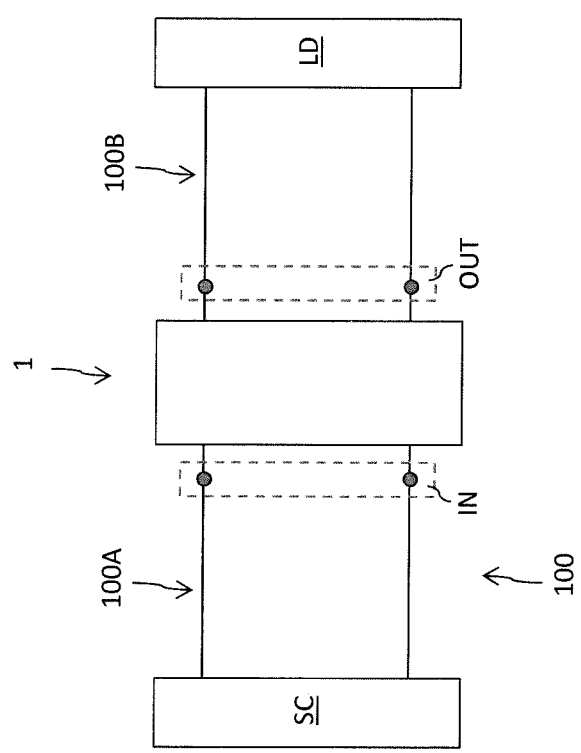
FIG. 1 is a block diagram of a LV electric line to which an electronic protection device, according to the invention, is operatively associated.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

With reference to the cited figures, the present invention relates to an electronic protection device 1, which, in operation, is associated to a LV electric line 100.

The electric line 100 comprises one or more phase conductors P and, preferably, a neutral conductor N.

Preferably, the electric line 100 comprises a single phase conductor P and a neutral conductor N.

In the following, the electronic protection device 1 will be described with reference to its installation in an electric line having a single phase conductor P and a neutral conductor N for the sake of simplicity only, without intending to limit the scope of the invention. As the skilled person will certainly understand, the electric line 100 may, in fact, have different arrangements for its own conductors, according to the needs.

The electric line 100 is intended to electrically connect an electric power source SC and an electric load LD, which may be of any type.

In operation, the electronic protection device 1 allows or interrupts a current flow between the electric power source SC and the electric load LD, more precisely between upstream portions 100A and downstream portions 100B of the electric line 100, which are electrically connected with the electric power source SC and the electric load LD, respectively.

Figure 2A:
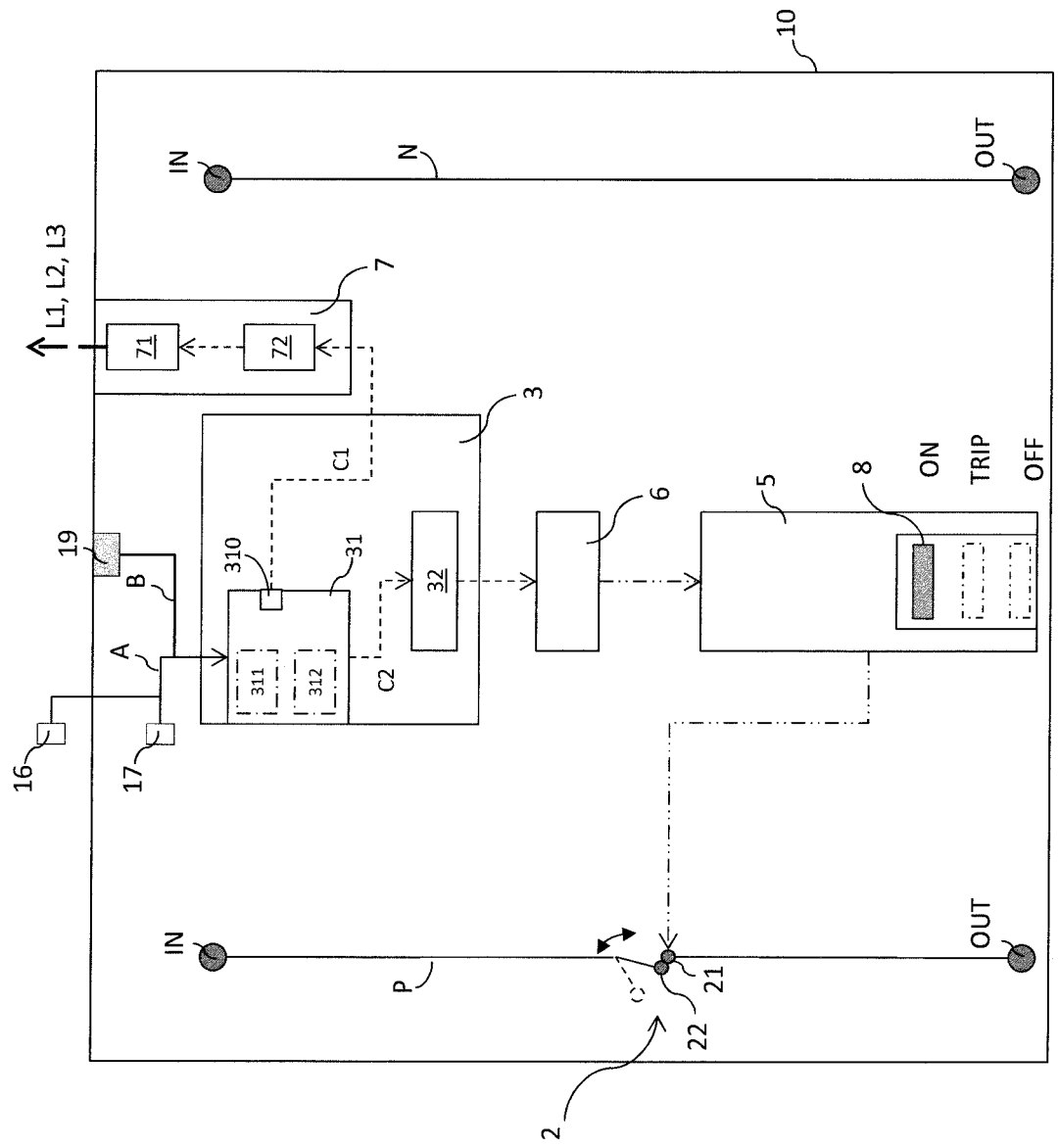
FIGS. 2A-2B are block diagrams of the electronic protection device, according to the invention (in a closed state) according to different possible configurations.
Figure 2B:
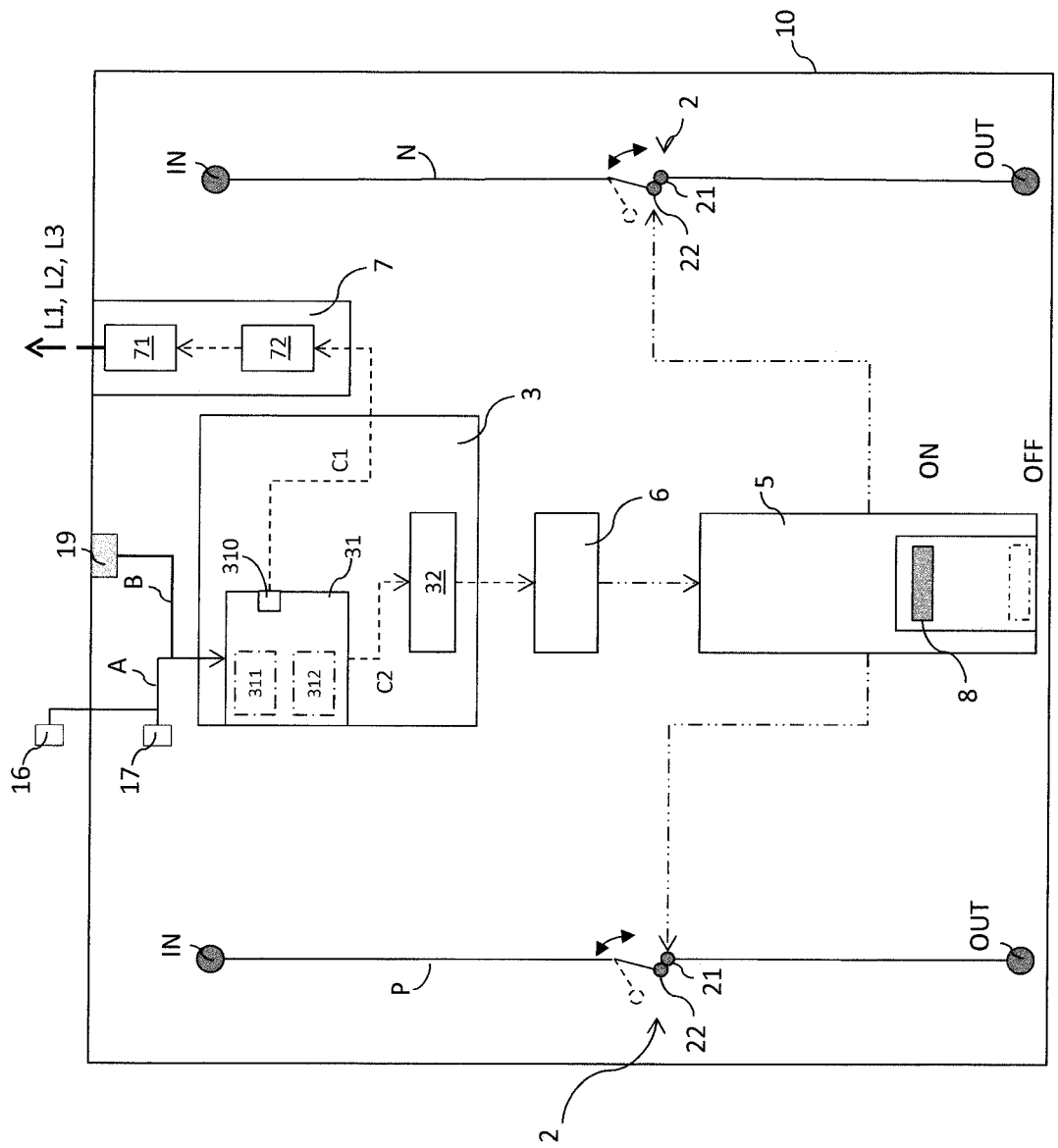
Figure 3:
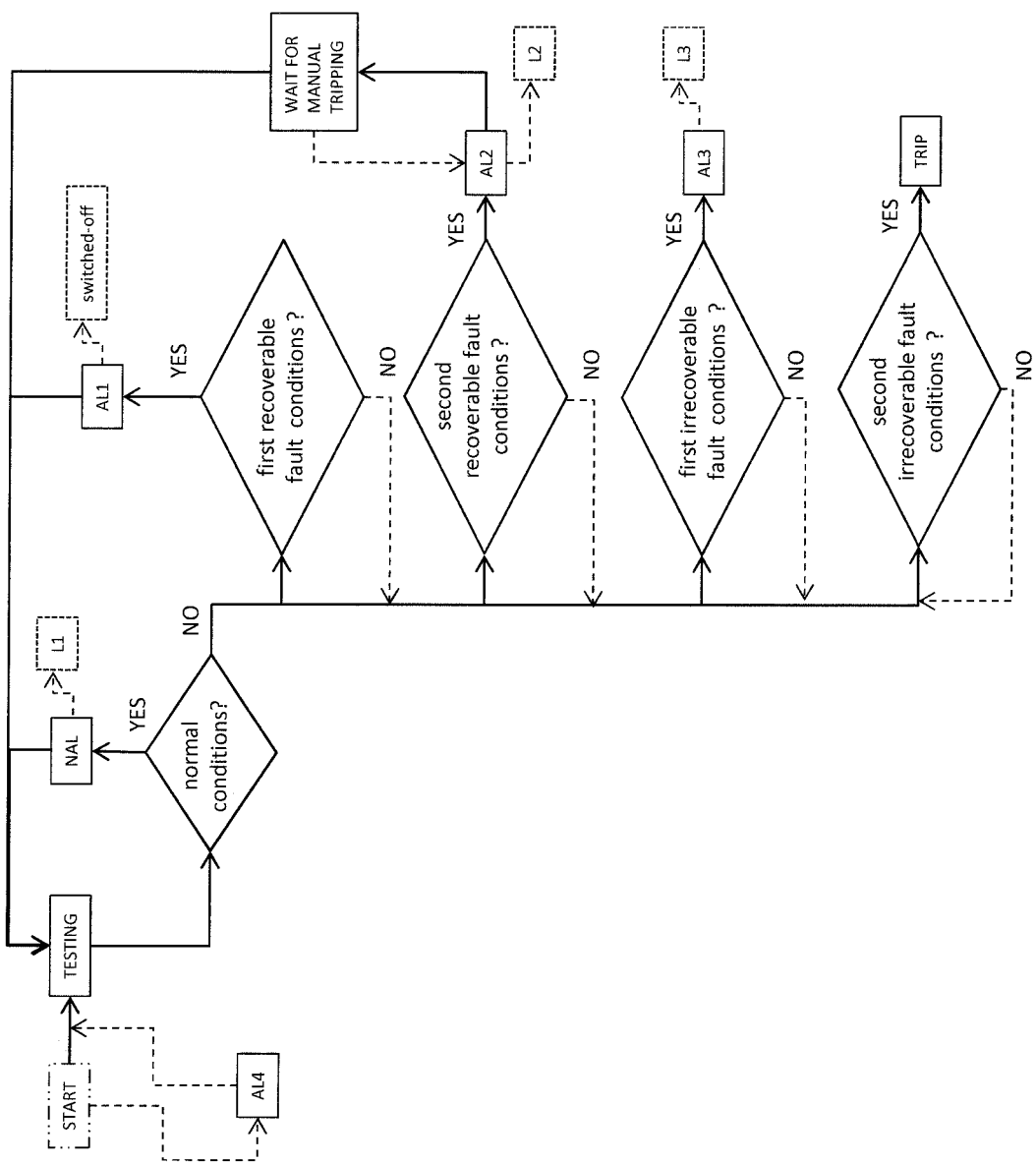
FIG. 3 is a block diagram illustrating the operation of the electronic protection device of FIGS. 2A-2B.

Conveniently, the electronic protection device 1 may be arranged according to different configurations as shown in FIGS. 2A-2B.

When it is arranged according to the configuration shown in FIG. 2A (typically dedicated to the North-American market), the electronic protection device 1 can take three different operative states, namely a closed state, a tripped state and an open state, during its operating life.

When it is arranged according to the configuration shown in FIG. 2B (typically dedicated to the European and other international markets), the electronic protection device 1 can take two different operative states, namely a closed state and an open state, during its operating life.

When it operates in the closed state, the electronic protection device 1 allows a current to flow along the electric line 100 between the upstream and downstream portions 100A, 100B of this latter.

When it operates in the tripped state or in the open state, the electronic protection device 1 is able to interrupt the current flow along the electric line 100, thereby electrically disconnecting the upstream and downstream portions 100A, 100B of this latter.

The electronic protection device 1 comprises an outer casing 10 (preferably made of an electrically insulating material) adapted to be fixed to a supporting structure (not shown).

The outer casing 10 advantageously defines an internal volume accommodating the internal components of the electronic protection device 1.

The electronic protection device 1 comprises a plurality of input terminals IN and a plurality of output terminals OUT.

In most installation configurations (FIG. 1), the input terminals IN are intended to be electrically connected to the electric power source SC whereas the output terminals OUT are intended to be electrically connected to the electric load LD.

In these cases, each input terminal IN is electrically connected to a corresponding conductor P, N of the upstream portion 100A of the electric line, which is in turn electrically connected with the electric power source SC, and each output terminal OUT is electrically connected to a corresponding conductor P, N of the load portion 100B of the electric line, which is in turn electrically connected with the electric load LD.

However, according to alternative installation configurations (not shown), the input terminals IN may be electrically connected to the electric load LD and the output terminals OUT may be electrically connected to the electric power source SC.

In general, the number of input and output terminals IN, OUT depends on the number of conductors of the electric line 100.

The input and output terminals IN, OUT may be formed by conductive connectors positioned at or in proximity of the outer casing 10.

The electronic protection device 1 comprises one or more pairs of electric contacts 2 advantageously accommodated in the internal volume defined by the outer casing 10.

When it is arranged according to the configuration shown in FIG. 2A, the electronic protection device 1 comprises a pair of electric contacts 2 for each phase conductor P of the electric line 100 whereas no electric contacts 2 are operatively associated with the neutral conductor N.

When it is arranged according to the configuration shown in FIG. 2B, the electronic protection device 1 comprises a pair of electric contacts 2 for each phase conductor P and for the neutral conductor N of the electric line 100.

Each pair of electric contacts 2 is electrically connected with corresponding input and output terminals IN, OUT.

The electrical connections between the electric contacts 2 and the corresponding input and output terminals IN, OUT can be realized according to solutions known to the skilled person.

In operation, the electric contacts 2 are coupled one with another or separated one from another.

When the electric contacts 2 are mutually coupled, the protection device 1 is in a closed state and a current flow between the corresponding input and output terminals IN, OUT is allowed. In this way, a current flow is enabled between the upstream and downstream portions 100A, 100B of the electric line 100 electrically connected with the input and output terminals IN, OUT, respectively. When the electric contacts 2 are decoupled, the protection device 1 is in a tripped state or open state and the current flow between the corresponding input and output terminals IN, OUT is interrupted. In this way, it is interrupted the current flow between the upstream and downstream portions 100A, 100B of the electric line 100, which are electrically connected with the input and output terminals IN, OUT respectively.

The skilled person will certainly understand that, in operation, all the pairs of electric contacts 2 of the electronic protection device are operated in a coordinated manner in a coupled state or in a decoupled state for obvious purposes of electrical continuity and current balancing.

Each pair of electric contacts 2 comprises a fixed contact 21 and a movable contact 22.

Preferably, as shown in the cited figures, the fixed contact 21 is electrically connected with a corresponding output terminal OUT whereas the movable contact 22 is electrically connected with a corresponding input terminal IN.

However, in some embodiments of the invention, the fixed contact 21 may be electrically connected with a corresponding input terminal IN and the movable contact 22 may be electrically connected with a corresponding output terminal OUT.

Conveniently, the electronic protection device 1 comprises a handle 8.

Preferably, the handle 8 protrudes at least partially from the outer casing 10.

The handle 8 is movable, preferably around a suitable rotation axis, and it may be actuated by internal components of the protection device 1, by a user or by external equipment.

When the electronic protection device 1 is arranged according to the configuration shown in FIG. 2A, the handle 8 is reversibly movable among three positions, namely in a first position ON, in a second position TRIP or in a third position OFF, which respectively correspond to the closed state, the tripped state or the open state of the electronic protection device.

In other words, when the electronic protection device is in the closed state, in the tripped state or in the open state, the handle 8 is positioned in the first position ON, in the second position TRIP or in the third position OFF, respectively.

When the electronic protection device 1 is arranged according to the configuration shown in FIG. 2B, the handle 8 is reversibly movable between two positions only, namely in a first position ON or in a third position OFF, which respectively correspond to the closed state or the open state of the electronic protection device.

In other words, when the electronic protection device is in the closed state or in the open state, the handle 8 is positioned in the first position ON or in the third position OFF, respectively.

Conveniently, the electronic protection device 1 comprises an operating mechanism 5 advantageously accommodated in the internal volume defined by the outer casing 10.

The operating mechanism 5 is operatively connected with the electric contacts 2 and the handle 8 and, in operation, it mechanically interacts with these components of the electronic protection device.

More particularly, the operating mechanism 5 moves the movable contact 22 so as to couple or separate this latter with or from the corresponding fixed contact 21.

When the electronic protection device 1 is arranged according to the configuration shown in FIG. 2A, the operating mechanism 5 moves the handle 8 between the first position ON and the second position TRIP during a closed-to-tripped state transition of the electronic protection device and is actuated by the handle 8 during the tripped-to-open or open-to-closed state transitions (re-closing manoeuvre) of the electronic protection device.

When the electronic protection device 1 is arranged according to the configuration shown in FIG. 2B, the operating mechanism 5 moves the handle 8 between the first position ON and the third position OFF during a closed-to-open state transition of the electronic protection device and is actuated by the handle 8 during an open-to-closed state transition (re-closing manoeuvre) of the electronic protection device.

The electronic protection device 1 comprises a tripping unit 6 adapted to mechanically actuate the operating mechanism 5.

In operation the tripping unit 6 actuates the operating mechanism 5 in order to make the electronic protection device to pass from the closed state to the tripped state (configuration of FIG. 2A) or from the closed state to the open state (configuration of FIG. 2B).

Preferably, the tripping unit 6 is fed by the electric line 100.

As an example, the tripping unit 6 may be electrically connected with the output terminals OUT or with the input terminals IN of the electric protection device 1, which are operatively associated with the phase conductor P and the neutral conductor N of the electric line 100.

Further alternative solutions, which may be implemented according to the installation needs, are possible and evident to the skilled person.

The electronic protection device 1 comprises a control unit 3 advantageously accommodated in the internal volume defined by the outer casing 10.

The control unit 3 comprises a controller 31 that may include data processing resources, preferably of digital type, e.g. one or more microcontrollers capable of executing stored software instructions. An important function of the controller 31 consists in determining whether there are intervention conditions requiring the tripping of the electronic protection device 1 from the closed state to the tripping state (configuration of FIG. 2A) or from the closed state to the open state (configuration of FIG. 2B).

The controller 31 is capable of checking whether the electric line 100 is subject to fault conditions, e.g. ground fault conditions, arc fault conditions, short-circuit conditions, overvoltage conditions, and so on.

The controller 31 may determine the presence of fault conditions in the electric line 100 by executing check routines 312 including suitable software instructions conveniently stored in a memory of said controller.

The controller 31 may conveniently execute said check routines 312 upon receiving detection signals D from internal or external sensors 16, 17 (e.g. current or voltage sensors) of the electronic protection device 1, which are operatively associated to the conductors of the electric line 100 and in communication with the control unit 3.

By executing said check routines 312, the controller 31 may implement suitable check algorithms to check the operating conditions of the electric line 100.

Said check algorithms may be of known type and will not here further described for the sake of brevity.

The controller 31 is capable of testing the operating conditions of the electronic protection device 1 and determine whether said electronic protection device is subject to fault conditions.

More particularly, the electronic protection device 1 is capable of testing the operating conditions of one or more internal components of said electronic protection device and determining whether said components are subject to fault conditions.

For the sake of clarity, a component of the electronic protection device 1 is referred to as an "internal component" if it is arranged within the internal volume of said electronic protection device.

Internal components of the electronic protection device 1 may include firmware components of the controller 31, firmware components of data processing devices arranged internally to the casing 10 and operatively coupled to the controller 31, electronic circuitry of the control unit 3, sensors or electronic circuits arranged internally to the casing 10 and operatively coupled with the control unit 3, and so on.

Preferably, the controller 31 tests the operating conditions of the electronic protection device 1 by executing suitable test routines 311 including suitable software instructions conveniently stored in a memory of said controller.

Preferably, said test routines 311 are executed cyclically by the controller 31. As an example, an execution cycle of said test routines 311 may take some minutes.

During the execution of said test routines 311, the controller 31 may provide suitable test signals to hardware components of the electronic protection device and check the behavior of said hardware components in response to said test signals and/or it may implement suitable test algorithms to check the content of data processing registers or memories and/or to check the behavior of its own firmware components or of firmware components of other data processing devices interacting with said controller.

The above-mentioned test algorithms may be of known type and will not here further described for the sake of brevity.

In addition to the above, the controller 31 may determine the presence of intervention conditions if it receives intervention signals from external devices (not shown) or from a test interface 19 (e.g. a test button) of the electronic protection device 1, which can be manually activated by a user.

Conveniently, when it determines the presence of intervention conditions, the controller 31 generates second control signals C2 to activate the tripping unit 6.

Preferably, the control unit 3 comprises a driving interface 32 configured to receive the control signals C2 and activate the tripping unit 6 in response of the control signals C2.

Preferably, the control unit 3 is fed by the electric line 100.

As an example, the control unit 3 may be electrically connected with the output terminals OUT or with the input terminals IN of the electric protection device 1, which are operatively associated with the phase conductor P and the neutral conductor N of the electric line 100.

Further alternative solutions, which may be implemented according to the installation needs, are possible and evident to the skilled person.

In operation, the electronic protection device 1 passes from one of the mentioned operative states to another in accordance with the operative modes that will be briefly described in the following with reference to the configurations of FIGS. 2A, 2B.

Configuration of FIG. 2A

The electronic protection device 1 automatically (i.e. without the intervention of the user or external equipment) passes from the closed state to the tripped state when the tripping unit 6 mechanically actuates the operating mechanism 5.

The tripping unit 6 may trip the operating mechanism 5 in an autonomous manner, for example, when it comprises a magneto-thermic trip arrangement sensitive to short-circuits or over-load conditions in the electric line 100, or in response to activation by the controller 31, when this latter determines the presence of intervention conditions.

In response to the actuation by the tripping unit 6, the operating mechanism 5 separates the electric contacts 2 and moves the handle 8 from the first position ON to the second position TRIP.

The electronic protection device 1 passes from the tripped state to the open state only when the handle 8 is mechanically actuated by a user or by external equipment. The operating mechanism 5 maintains separated the electric contacts 2 in response to a movement of the handle 8 from the second position TRIP to the third position OFF.

The electronic protection device 1 passes from the closed state to the open state, or vice-versa, only when the handle 8 is mechanically actuated by a user or by external equipment. The operating mechanism 5 couples the electric contacts 2 in response to a movement of the handle 8 from the third position OFF to the first position ON.

The operating mechanism 5 decouples the electric contacts 2 in response to a movement of the handle 8 from the first position ON to the third position OFF.

Configuration of FIG. 2B

The electronic protection device 1 automatically (i.e. without the intervention of the user or external equipment) passes from the closed state to the open state when the tripping unit 6 mechanically actuates the operating mechanism 5.

The tripping unit 6 may trip the operating mechanism 5 in an autonomous manner, for example, when it comprises a magneto-thermic trip arrangement sensitive to short-circuits or over-load conditions in the electric line 100, or in response to activation by the controller 31, when this latter determines the presence of intervention conditions.

In response to the actuation by the tripping unit 6, the operating mechanism 5 separates the electric contacts 2 and moves the handle 8 from the first position ON to the third position OFF.

The electronic protection device 1 passes from the closed state to the open state, or vice-versa, when the handle 8 is mechanically actuated by a user or by external equipment. The operating mechanism 5 couples the electric contacts 2 in response to a movement of the handle 8 from the third position OFF to the first position ON.

The operating mechanism 5 decouples the electric contacts 2 in response to a movement of the handle 8 from the first position ON to the third position OFF.

The electronic protection device 1 comprises a signalling arrangement 7 including one or more signalling devices (reference 71) capable of emitting light signals.

Conveniently, said one or more signalling devices are arranged in such a way that the emitting light signals are visible from the exterior of the outer casing 10 of the electronic protection device 1.

Preferably, said one or more signalling devices include one or more LEDs emitting light signals externally to the outer casing 10.

Advantageously, the controller 31 is capable of controlling the operation of the signalling devices through the generation of suitable control signals C1.

Preferably, the signalling arrangement 7 comprises a circuit interface 72 to drive said signalling devices on the base of the control signals C1 received from the controller 31.

Preferably, the signalling arrangement 7 is fed by the electric line 100.

As an example, the signalling arrangement 7 may be electrically connected with the output terminals OUT or with the input terminals IN of the electric protection device 1, which are operatively associated with the phase conductor P and the neutral conductor N of the electric line 100.

Further alternative solutions, which may be implemented according to the installation needs, are possible and evident to the skilled person.

An important differentiating feature of the electronic protection device 1 with respect to currently available electronic protection devices consists in that the signalling arrangement 7 comprises a first signalling device 71, which, in operation, provides light signals L1, L2, L3 indicative of the operating conditions of said electronic protection device, when said electronic protection device is in the above-mentioned closed state.

Preferably, the signalling device 1 is a LED driven by the controller 31 through the circuit interface 72.

Preferably, in operation, the controller 31 drives the first signalling device 71 in a non-alarm state NAL, if said controller determines normal operating conditions for the electronic protection device, preferably upon the execution of the above-mentioned test routines 311.

Of course, even when it has driven the first signalling device 71 in the non-alarm state NAL, the controller 31 continues to test the operating conditions of the electronic protection device, preferably by executing the above-mentioned test routines 311.

As it will be illustrated in the following, the controller 31 will take further actions when certain fault conditions for the electronic protection device 1 (more particularly for the internal components thereof) are determined.

Preferably, when it is driven in the non-alarm state NAL by the controller 31, the first signalling device 71 provides a first light signal L1 indicative of normal operating conditions for the electronic protection device 1.

Preferably, the first light signal L1 is formed by a continuous light signal of a predefined color, e.g. green.

Thanks to the above-described solution, the electronic protection device 1 provides relevant advantages during installation or routine maintenance controls, particularly when the electronic protection device is installed in cellars or dark environments.

In fact, since the signalling device 71 operates according to a "normally on" operation mode, a user can immediately understand whether the electronic protection device is working properly by simply observing this latter, even if it has not tripped in the tripped state.

Advantageously, even when it determines fault conditions for the electronic protection device, upon the execution of the above-mentioned test routines 311, the controller 1 manages the operation of the signalling device 71 in such a way to ensure safe conditions for a user and in such a way to let a user immediately acquire visual information on the type and seriousness of a fault occurring to internal components of the electronic protection device.

Preferably, in operation, if it determines first recoverable fault conditions for the electronic protection device 1, the controller 31 drives the first signalling device 71 in a first alarm state AL1, in which said first signalling device is switched off. In this way, no light signals towards the exterior of the electronic protection device.

Preferably, the above mentioned first recoverable fault conditions include fault conditions that are considered as "recoverable" by the controller 31 since, statistically, they are often due to fault events or disturbances of transitory type for which a tripping event is not mandatory or convenient.

Preferably, said first recoverable fault conditions include fault conditions related to first internal hardware components of the electronic protection device (e.g. malfunctions of electronic circuitry of the control unit 3 or sensors or electronic circuits arranged internally to the casing 10) or fault conditions related to memories of the controller 31 or, more generally, of the control unit 3 (e.g. memory stack overflow conditions) or fault conditions related to particular operations carried out by the controller (e.g. watchdog timeout conditions).

Preferably, in operation, the controller 31 continues to test the operating conditions of the electronic protection device 1 after having driven the first signalling device 71 in the first alarm state AL1.

Preferably, in operation, the controller 31 drives the first signalling device 71 from the first alarm state AL1 to the non-alarm state NAL, if it determines normal operating conditions for the electronic protection device again. Otherwise, the controller 31 continues to maintain the first signalling device 71 in the first alarm state AL1.

In practice, if the above mentioned first recoverable fault conditions are really of the transitory type, the first signalling device 71 will signal again normal operating conditions after having been switched off for a given time interval. Otherwise, it will continue to remain switched off, thereby making the user aware that some specific components of the electronic protection device may be subject to permanent fault conditions.

Preferably, in operation, if it determines second recoverable fault conditions for the electronic protection device 1, the controller 31 drives the first signalling device 71 in a second alarm state AL2.

Preferably, when it is driven in the second alarm state AL2, the first signalling device 71 provides at least a second light signal L2 indicative of fault conditions for the electronic protection device 1.

Preferably, the second light signal L2 is formed by a blinking light signal.

Preferably, the above mentioned second recoverable fault conditions include abnormal operating conditions (e.g. an abnormal tripping time) detected during a tripping event of the electronic protection device, e.g. a tripping due to a trip test carried out by the user by manually intervening on the test interface 19.

In addition, these fault conditions are conveniently considered as "recoverable" by the controller 31 since, statistically, they are often due to disturbances of transitory type.

For this reason, after having driven the first signalling device 71 in the second alarm state AL2, the controller 31 behaves somehow similarly to what described above.

Preferably, in operation, after having driven the first signalling device 71 in the second alarm state AL2, the controller 31 waits for a manual test on the electronic protection device 1 and it maintains the first signalling device 71 in the second alarm state AL2 until said manual test is performed by the user.

The user may perform such a manual test by intervening on the test interface 19.

If the fault conditions are due to disturbances of transitory type, the manual test causes the tripping of the electronic protection device 1 in the tripped state (configuration of FIG. 2A) or open state (configuration of FIG. 2B). Then, the user can subsequently move the handle 8 to bring again (re-closing manoeuvre) the electronic protection device in the closed state.

Preferably, in operation, the controller 31 tests again the operating conditions of the electronic protection device after a user has performed the above-mentioned re-closing manoeuvre on said electronic protection device.

Preferably, in operation, the controller 31 drives the first signalling device 71 from the second alarm state AL2 to the non-alarm state NAL, if it determines normal operating conditions for the electronic protection device again. Otherwise, the controller 31 continues to maintain the first signalling device 71 in the second alarm state AL2.

If the fault conditions are due to disturbances of permanent type, the manual test does not cause the tripping of the electronic protection device 1 in the tripped state or open state.

In this case, the controller 31 continues to maintain the first signalling device 71 in the second alarm state AL2.

In practice, if the above-mentioned second recoverable fault conditions are really of the transitory type, the first signalling device 71 will signal again normal operating conditions after the manual test. Otherwise, it will continue to remain in the second alarm state AL2, thereby making the user aware that some specific components of the electronic protection device may be subject to permanent fault conditions.

Preferably, in operation, if it determines first irrecoverable fault conditions for the electronic protection device 1, the controller 31 drives the first signalling device 71 in a third alarm state AL3. Preferably, when it is driven in the third alarm state AL3, the first signalling device 71 provides at least a third light signal L3 indicative of fault conditions for the electronic protection device 1.

Preferably, the third light signal L3 includes a blinking light signal, which may also coincide with the second light signal L2.

Preferably, the above mentioned first irrecoverable fault conditions include abnormal operating conditions of the firmware components on board the controller 31 or of data processing devices operatively coupled thereto (e.g. CPU registers, RAM, I/O ports, and so on).

Preferably, the above mentioned first irrecoverable fault conditions include fault conditions that are considered as "irrecoverable" by the controller 31 since, statistically, they are not linked to fault events or disturbances of transitory type.

Preferably, in operation, after having driven the first signalling device 71 in the third alarm state AL3, the controller 31 maintains said signalling device in such an operational state.

In practice, if first irrecoverable fault conditions are determined, the first signalling device 71 is driven and remains in the third alarm state AL3, thereby making the user aware that some specific components of the electronic protection device are subject to permanent fault conditions.

Preferably, in operation, if it determines second irrecoverable fault conditions for the electronic protection device 1, the controller 31 commands a tripping of the electronic protection device 1 in the tripped state (configuration of FIG. 2A) or to the open state (configuration of FIG. 2B), conveniently by outputting suitable control signals C2 to activate the tripping unit 6 as explained above.

Preferably, the above-mentioned second irrecoverable fault conditions include abnormal operating conditions of hardware components 310 that are used by the controller 31 to interact with the signalling arrangement 7 (e.g. I/O ports communicating with said signalling arrangement).

The above-illustrated solution is evidently aimed at ensuring safe conditions for the user in case the signalling arrangement 7 (more particularly the signalling device 71) is not allowed to correctly operate as it cannot be suitably driven by the controller 31.

As explained above, in operation, the controller 31 is capable of determining whether there are intervention conditions, which require the tripping of the electronic protection device 1 from the closed state to the tripping state or to the open state, and of activating the tripping unit 6, if the presence of intervention conditions is determined.

Preferably, in operation, the controller 31 drives the signalling device 71 in such a way to provide the user with information related to the intervention conditions that have caused a possible tripping of the electronic protection device 1, e.g. due to a fault in the electric line 100 or due to an external intervention command.

Preferably, in operation, after the occurrence of a trip event caused by the determination of intervention conditions, the controller 31 waits for a re-closing manoeuvre on the electronic protection device 1, which, for example, may be carried out manually by a user.

Preferably, in operation, the controller 31 drives the first signalling device 71 in a fourth alarm state AL4 for a short time interval (e.g. 5 s) after the above-mentioned manual re-closing manoeuvre on said electronic protection device is carried out.

Preferably, when it is driven in the fourth alarm state AL4, the first signalling device 71 provides at least a fourth light signals L4 indicative of the intervention conditions that have been determined by the controller 31.

The light signals L4 may comprise, for example, light signals blinking with different blinking patterns, each indicative of a corresponding intervention condition determined by the controller 31, e.g. a light signal indicative of arc fault conditions, a light signal indicative of ground fault conditions, and the like.

After the above-mentioned time interval has passed, the controller 1 conveniently starts operating as explained above, thereby testing the operating conditions of the internal components of the electronic protection device 1.

For the sake of clarity, the operation of the first signalling device 71 in relation to the operative conditions for the electronic protection device 1, as determined by the controller 31, is summarized in the following table:

| determined conditions for the electronic protection device | operative state of the first signalling device | light signals emitted by the first signalling device |
|---|---|---|
| normal conditions | NAL | L1 |
| first recoverable conditions | AL1 (switched off) | none |
| second recoverable conditions | AL2 | L2 |
| first irrecoverable conditions | AL3 | L3 |
| second irrecoverable conditions | — | — |
| intervention conditions | AL4 | L4 |

In practice, it has been found that the electronic protection device, according to the invention, fully achieves the intended aim and objects.

The electronic protection device 1, according to the invention, provides improved signalling functionalities with respect to traditional devices of the same kind, as it is capable of providing visual information on the operating conditions of internal components of said electronic protection device.

The user can be informed about the nature and seriousness of possible faults of internal components of said electronic protection device 1 even when this latter is in a closed state, thus ensuring a continuity of service.

The electronic protection device 1 has a compact structure with a size similar to currently available electronic protection devices.

The electronic protection device 1 has proven to be easy to industrially manufacture, at competitive costs with respect to currently available electronic protection devices.

The invention claimed is:

1. An electronic protection device for a LV electric line including one or more conductors (P, N), comprising:
   one or more pairs of electric contacts electrically connectable with corresponding conductors of said electric line and mutually coupled or decoupled, said electric contacts being coupled when said protection device is in a closed state and being decoupled when said protection device is in a tripped state or open state;

a control unit comprising a controller including data processing resources, said controller being capable of testing for a fault condition of an internal component of said electronic protection device;

a signalling arrangement including one or more signalling devices driven by said controller, said signalling arrangement comprises a first signalling device adapted to provide light signals indicative of the fault condition of the internal component of said electronic protection device, when said electronic protection device is in the closed state;

wherein said controller drives said first signalling device in a non-alarm state (NAL), if said controller determines normal operating conditions of the internal component of said electronic protection device, said first signalling device emitting a first light signal (L1) indicative of normal operating conditions of the internal component of said electronic protection device, when said first signalling device is driven in said non-alarm state;

wherein said controller drives said first signalling device in a first alarm state (AL1) if said controller determines first recoverable fault conditions of the internal component of said electronic protection device, said first signalling device being switched-off when said first signalling device is driven in said first alarm state (AL1), and wherein said controller continues to test for the fault condition of the internal component of said electronic protection device after having driven said first signalling device in said first alarm state (AL1) and drives said first signalling device from said first alarm state (AL1) to said non-alarm state (NAL), said first signalling device thereby re-emitting said first light signal (L1), if said controller determines normal operating conditions of the internal component of said electronic protection device again.

2. The electronic protection device, according to claim 1, wherein said first light signal (L1) includes a continuous light signal of a predefined color.

3. The electronic protection device, according to claim 1, wherein said controller drives said first signalling device in a second alarm state (AL2), if said controller determines second recoverable fault conditions of the internal component of said electronic protection device.

4. The electronic protection device, according to claim 3, wherein said first signalling device emits a second light signal (L2) indicative of fault conditions of the internal component of said electronic protection device, when said first signalling device is driven in said second alarm state (AL2).

5. The electronic protection device, according to claim 3, wherein said controller maintains said first signalling device in said second alarm state (AL2) at least until a user has performed a manual test on said electronic protection device.

6. The electronic protection device, according to claim 1, wherein said controller drives said first signalling device in a third alarm state (AL3), if said controller determines first irrecoverable fault conditions of the internal component of said electronic protection device.

7. The electronic protection device, according to claim 6, wherein said first signalling device emits a third light signal (L3) indicative of fault conditions of the internal component of said electronic protection device, when said first signalling device is driven in said third alarm state (AL3).

8. The electronic protection device, according to claim 1, wherein said controller commands a tripping of said electronic protection device in said tripped state or in said open state, if said controller determines second irrecoverable fault conditions of the internal component of said electronic protection device.

9. The electronic protection device, according to claim 1, which further comprises:
a handle movable in a first position (ON) corresponding to the closed state of said electronic protection device, in a second position (TRIP) corresponding to a tripped state of said electronic protection device or in a third position (OFF) corresponding to an open state of said electronic protection device;
an operating mechanism adapted to mechanically interact with said electric contacts and with said handle;
a tripping unit adapted to actuate said operating mechanism.

10. The electronic protection device, according to claim 1, which further comprises:
a handle movable in a first position (ON) corresponding to the closed state of said electronic protection device and in a third position (OFF) corresponding to an open state of said electronic protection device;
an operating mechanism adapted to mechanically interact with said electric contacts and with said handle;
a tripping unit adapted to actuate said operating mechanism.

11. The electronic protection device, according to claim 1, wherein said first signalling device comprises a LED.

12. The electronic protection device, according to claim 4, wherein said controller maintains said first signalling device in said second alarm state (AL2) at least until a user has performed a manual test on said electronic protection device.

* * * * *